United States Patent [19]
Staton

[11] Patent Number: 5,834,957
[45] Date of Patent: Nov. 10, 1998

[54] IMPLEMENTING ASYNCHRONOUS SEQUENTIAL CIRCUITS USING SYNCHRONOUS DESIGN TECHNIQUES AND MODULES

[75] Inventor: Kenneth L. Staton, San Carlos, Calif.

[73] Assignee: Hewlett-Packard Company, Palo Alto, Calif.

[21] Appl. No.: 770,313

[22] Filed: Dec. 20, 1996

[51] Int. Cl.[6] .................................... H03K 3/00
[52] U.S. Cl. ........................... 327/141; 327/146
[58] Field of Search ................... 327/141, 142, 327/144–146, 291, 299

[56] References Cited

U.S. PATENT DOCUMENTS

| | | | |
|---|---|---|---|
| 4,396,905 | 8/1983 | Chan et al. | 327/141 |
| 4,926,445 | 5/1990 | Robb | 327/141 |
| 5,389,838 | 2/1995 | Orengo | 327/141 |
| 5,555,213 | 9/1996 | Delong | 327/145 |

FOREIGN PATENT DOCUMENTS

| | | | |
|---|---|---|---|
| 4037062 | 5/1992 | Germany | 327/141 |

OTHER PUBLICATIONS

Hauck, Asynchronous Design Methodologies: An Overview Proc. IEEE, Jan. 1995, pp. 69–93, vol. 83, No. 1.
LIM, Design Methodology for Stoppable Clock Systems Proc. IEEE, Jan. 1986, pp. 65–69, vol. 133, Pt. E, No. 1.
Norwick, Synthesis of Asynchronous State Machines Using a Local Clock Proc. ICCAD, 1991, pp. 192–197.

*Primary Examiner*—Timothy P. Callahan
*Assistant Examiner*—T. T. Lam

[57] ABSTRACT

A design method for an asynchronous sequential circuit that employs synchronous design techniques wherein a synchronous sequential circuit is designed to perform a desired function. A terminating state for the synchronous sequential circuit is then defined wherein the terminating state occurs before a transition to an idle state in the synchronous sequential circuit. A circuit is provided for latching at least one asynchronous input for the asynchronous sequential circuit and a circuit is provided for generating a synchronous clock that drives the synchronous sequential circuit such that the synchronous clock is enabled by a latched asynchronous input and is disabled by the terminating state of the synchronous sequential circuit.

20 Claims, 6 Drawing Sheets

IMPLEMENTING ASYNCHRONOUS SEQUENTIAL CIRCUITS USING SYNCHRONOUS DESIGN TECHNIQUES AND MODULES

BACKGROUND OF THE INVENTION

1. Field of Invention

The present invention pertains to the fields of digital electronic circuits and design methods therefor. More particularly, this invention relates to implementing asynchronous sequential circuits using synchronous design techniques and modules.

2. Art Background

Sequential circuits are commonly employed in a wide variety of electronic systems and perform a variety of functions. A sequential circuit may be defined as an electronic circuit having a set of inputs and a set of outputs and having a set of logic for remembering a history of the inputs. The logic for remembering the history usually includes latch circuits or flip-flop circuits. Typically, the logic for remembering the history represents the history as a stable unique state of stored information which may be referred to as a state. Such a sequential circuit usually includes a set of logic that generates a next state based on a current state and the inputs.

Such a sequential circuit is typically implemented as either a synchronous sequential circuit or an asynchronous sequential circuit. Typically, a synchronous sequential circuit has one or more clock signals that regulate other signals propagating through the synchronous circuit. Typically, the latch or flip-flop circuits in such a synchronous sequential circuit respond to the clock signal. An asynchronous sequential circuit, on the other hand, has no such clock signal. As a consequence, asynchronous sequential circuits typically have lower average output switching rates than comparable synchronous sequential circuits.

Such lower average switching rates in asynchronous sequential circuits usually causes less electrical power consumption than comparable synchronous sequential circuits. Such differences in power consumption are particularly evident in sequential circuits which are implemented with complementary metal oxide semiconductor (CMOS) technology. In addition, prior asynchronous sequential circuits typically have lower average radiated emissions in comparison to synchronous sequential circuits due to the lower average switching rate and lower periodicity.

Moreover, the absence of a continuously running clock usually reduces undesirable electrical coupling between such an asynchronous sequential circuit and other sensitive electrical circuits. Further, the availability of valid outputs from a synchronous sequential circuit is usually limited by the worst case signal path propagation through the logic circuitry contained therein. Such worst case signal path limits typically lower the overall speed of prior synchronous sequential circuits in comparison to prior asynchronous sequential circuits.

These advantages available with asynchronous sequential circuits notwithstanding, the design process for such asynchronous circuits is usually more cumbersome than the design process for synchronous circuits. Prior design techniques for asynchronous circuits typically require the manipulation of the circuitry detail to realize a correctly working sequential circuit given the differing signal path delays in the circuitry and given externally imposed system-level restrictions. Unfortunately, such prior design techniques typically increase the design time for asynchronous sequential circuits in comparison to synchronous sequential circuits and thereby increase the overall costs and delays involved in developing electronic systems with asynchronous sequential circuits. In addition, such prior asynchronous design techniques usually yield electronic circuits that are difficult to test and analyze.

SUMMARY OF THE INVENTION

A design method for asynchronous sequential circuits is disclosed that employs synchronous design techniques. Initially, a synchronous sequential circuit is designed to perform a desired function. A terminating state for the synchronous sequential circuit is then defined wherein the terminating state occurs before an unconditional transition to an idle state in the synchronous sequential circuit. A circuit is provided for latching at least one asynchronous input for the asynchronous sequential circuit. A circuit is also provided for generating a synchronous clock that drives the synchronous sequential circuit such that the synchronous clock is enabled by a latched asynchronous input and is disabled by the terminating state of the synchronous sequential circuit. In addition, the synchronous clock circuitry is designed to provide well behaved start and stop characteristics.

An asynchronous sequential circuit according to the present method runs synchronously only while performing a desired function and therefore eliminates the undesirable power consumption and radiated energy otherwise found in synchronous sequential circuits. In addition, an asynchronous sequential circuit according to the present method realizes the advantages of synchronous design techniques. Complex asynchronous sequential circuit systems are implemented according to the present techniques by the interconnection of a collection of less complex sequential circuit modules.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
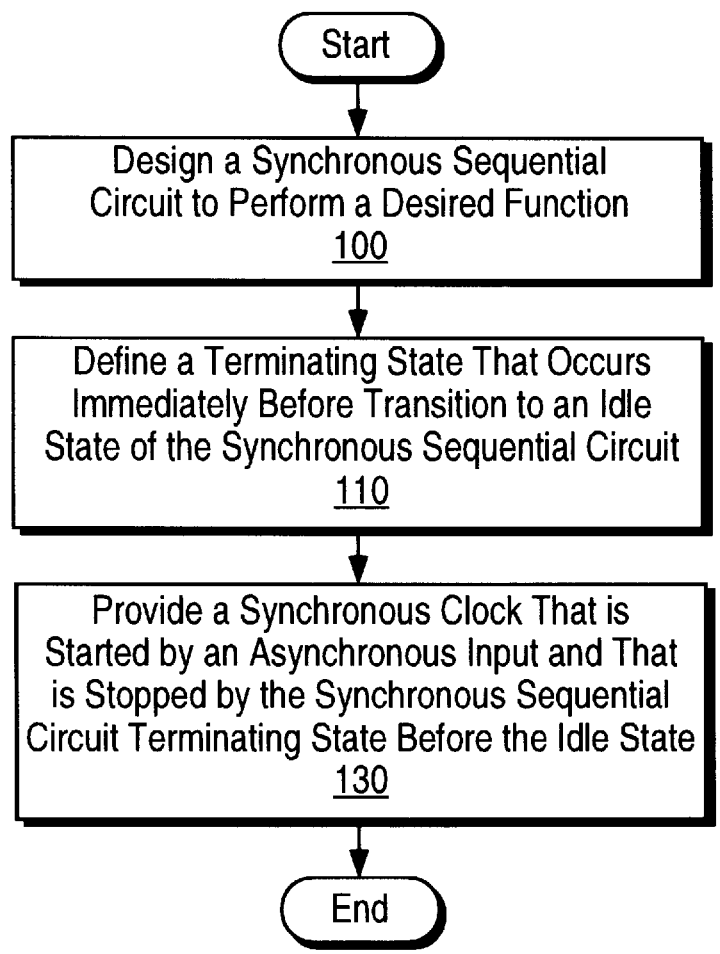
FIG. 1 illustrates a design method for implementing an asynchronous sequential circuit using synchronous design techniques.

FIG. 1 illustrates a design method for implementing an asynchronous sequential circuit using synchronous design techniques and modules. At step 100, a synchronous sequential circuit is designed to perform a desired function. The desired function is defined by a set of internal logical states and state transitions that occur in response to the inputs to the sequential circuit and a previous state of the sequential circuit. The internal logical states or the internal logical states and the inputs determine the logical states or logical levels of the outputs of the sequential circuit.

The synchronous sequential circuit includes both combinatorial logic and a means for remembering previous inputs. The implementation of the combinatorial logic at step 100 may be performed according to a variety of design techniques such as programmable logic design methods which may be computer-aided or automated. Other suitable synchronous design techniques include read-only memory (ROM) look-up table next state circuit techniques, discrete combinatorial logic next state circuit techniques, "one hot" circuit techniques wherein there is one flip-flop per state, and multiplexor next state circuit techniques. Still other suitable techniques include techniques for designing discrete logic using standard cells, techniques for designing gate level logic, as well as combinations of any or all of these techniques.

At step 110, a terminating state is defined for the synchronous sequential circuit which was designed at step 100. The terminating state is defined as a state that occurs immediately before the synchronous sequential circuit transitions back to an idle state after switching or transitioning through the internal logical states that perform the desired function.

At step 130, a circuit for generating a synchronous clock is provided to drive the synchronous sequential circuit such that the synchronous clock is started by the asynchronous input and is stopped by the synchronous sequential circuit reaching the terminating state. The terminating state defined at step 110 ensures that the synchronous clock that drives the synchronous sequential circuit remains enabled until the synchronous sequential circuit completes the desired function.

Figure 2:
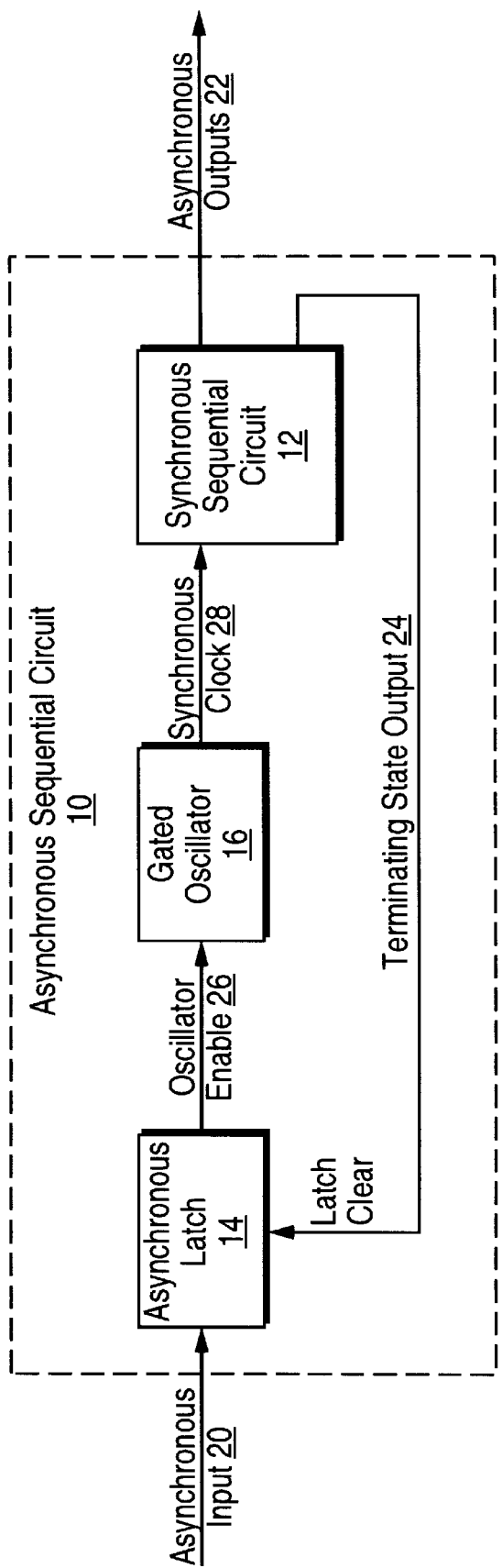
FIG. 2 illustrates an asynchronous sequential circuit designed according to the present design method.

FIG. 2 illustrates an asynchronous sequential circuit 10 designed according to the design method set forth above. The asynchronous sequential circuit 10 generates a set of asynchronous outputs 22 in response to an asynchronous input 20. The asynchronous sequential circuit 10 includes a synchronous sequential circuit 12 which is designed to perform the desired function in accordance with step 100. The synchronous sequential circuit 12 includes a terminating state that occurs immediately before the idle state in accordance with step 110. The synchronous sequential circuit 12 is driven by a synchronous clock 28.

The asynchronous input 20 provides an input to an asynchronous latch 14. One such asynchronous latch is required for each separate asynchronous input. The output of the latch 14 provides an oscillator enable signal 26 to a gated oscillator 16. The gated oscillator 16 generates the synchronous clock 28 that drives the synchronous sequential circuit 12. The synchronous sequential circuit 12 generates a latch clear signal 24 at the terminating state and the latch clear signal 24 clears the asynchronous latch 14 and disables the gated oscillator 16 in accordance with step 130.

The operation of the asynchronous sequential circuit 10 is as follows. A logic level transition of the asynchronous input 20 is latched by the asynchronous latch 14. The latched asynchronous input causes a transition of the oscillator enable signal 26 which starts the synchronous clock 28. The started synchronous clock 28 causes the synchronous sequential circuit 12 to transition from an idle state through the states that perform the desired function defined at step 100 and then to the terminating state and then back to the idle state. At the terminating state, the synchronous sequential circuit 12 asserts the latch clear 24 which clears the asynchronous latch 14 thereby disabling the gated oscillator 16 and maintaining the idle state of the synchronous sequential circuit 12. The asynchronous input 20 does not repeat another transition until the synchronous sequential circuit 12 has reached the idle state as indicated by the latch clear 24. Circuitry external to the asynchronous sequential circuit 10 can sample or "poll" the latch clear signal 24 to determine when another transition of the asynchronous input 20 can occur.

Figure 3:
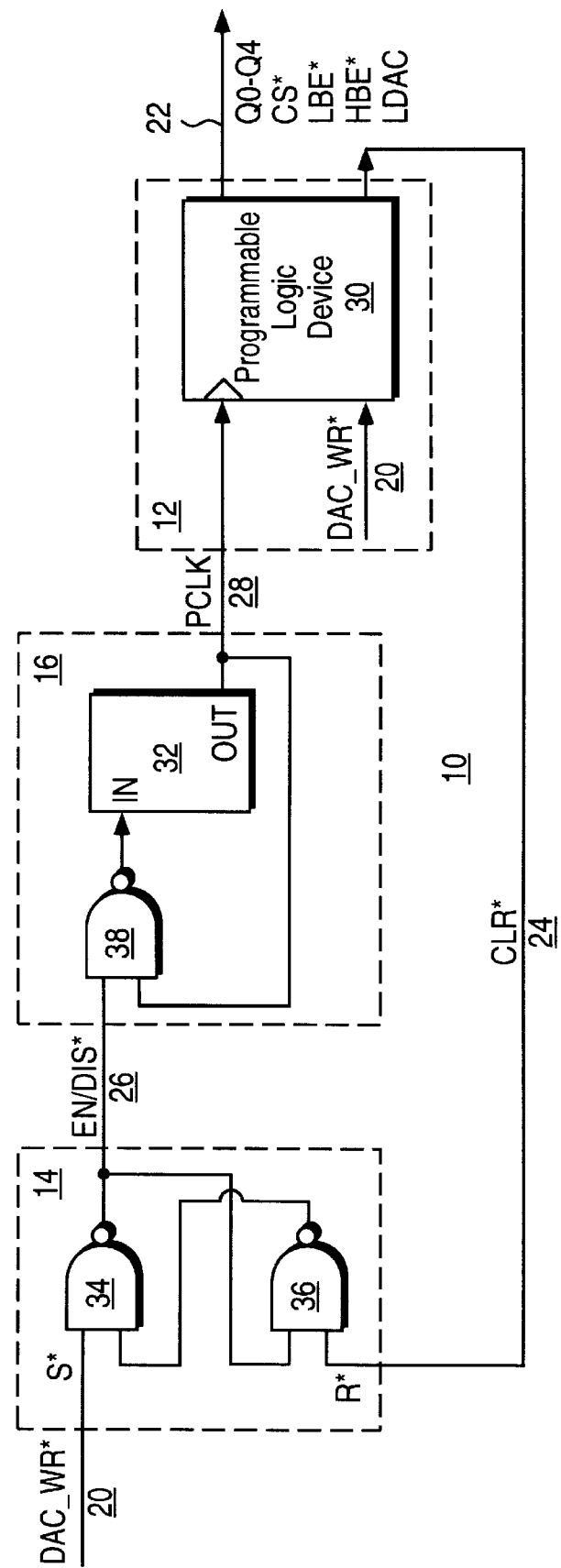
FIG. 3 illustrates the asynchronous sequential circuit in one embodiment that provides an interface between a processor and a digital-to-analog converter.

FIG. 3 shows the asynchronous sequential circuit 10 in one embodiment that provides an interface between a processor (not shown) and a digital-to-analog converter (DAC) (not shown). The asynchronous input 20 in this embodiment is a write strobe (DAC—WR*) from the processor. The * symbol indicates inverted logic levels, i.e. the write strobe DAC—WR* is asserted when at a low logic level and negated when at a high logic level. The asynchronous outputs 22 includes a set of state bits (Q0–Q4) and a set of control signals (CS*, LBE*, HBE*, and LDAC) for loading the digital-to-analog converter. The latch clear signal 24 is denoted as CLR*.

The synchronous sequential circuit 12 is realized by a programmable logic device 30 which is clocked by the synchronous clock 28 (PCLK) and has DAC—WR* as an input. In this embodiment, the frequency of the synchronous clock 28 is chosen to be 10 megahertz plus or minus 20 percent with a silicon delay line.

The asynchronous latch 14 is realized in this embodiment by a set/reset latch comprising a pair of logical NAND gates 34 and 36. In other embodiments, a set/reset latch may be implemented with NOR or other types of logic gates. The gated oscillator 16 is realized by a feedback circuit comprising a silicon delay line 32 and a logical NAND gate 38. The NAND gate 38 provides both the inversion, i.e. phase shift, to produce oscillation and an oscillator enable/disable control function.

The asynchronous input DAC—WR* is latched by the set/reset latch comprising the NAND gates 34 and 36. The output of the set/reset latch is the oscillator enable signal 26 (EN/DIS*) which starts the synchronous clock 28 (PCLK). The transition among the logical states implemented within the programmable logic device 30 performs the desired function and then in the terminating state the latch clear 24 (CLR*)is asserted. The asserted CLR* signal resets the set/reset latch comprising the NAND gates 34 and 36 and causes the EN/DIS* signal to disable the oscillator 16 through the NAND gate 38. The disabled oscillator 16 stops the PCLK and maintains the programmable logic device 30 in the idle state until another transition occurs in the DAC—WR* signal.

The NAND gate implementation shown for the asynchronous latch 14 is employed to handle a condition wherein the latch clear signal 24 CLR* may be asserted in the idle state of the programmable logic device 30 while the PCLK is static. This implementation results in the oscillator 16 being disabled if the DAC—WR* is negated and still allows the oscillator 16 to be enabled when the DAC—WR* input is asserted because both the DAC—WR* and the CLR* signals being asserted causes a high output for the EN/DIS* signal. The truth table for set/reset NAND implementation set forth below.

| DAC_WR* | CLR* | EN/DIS* | gate 36 out |
|---------|------|---------|-------------|
| 0 | 0 | 1 | 1 |
| 0 | 1 | 1 | 0 |
| 1 | 0 | 0 | 1 |
| 1 | 1 | no change | no change |

Figure 4:
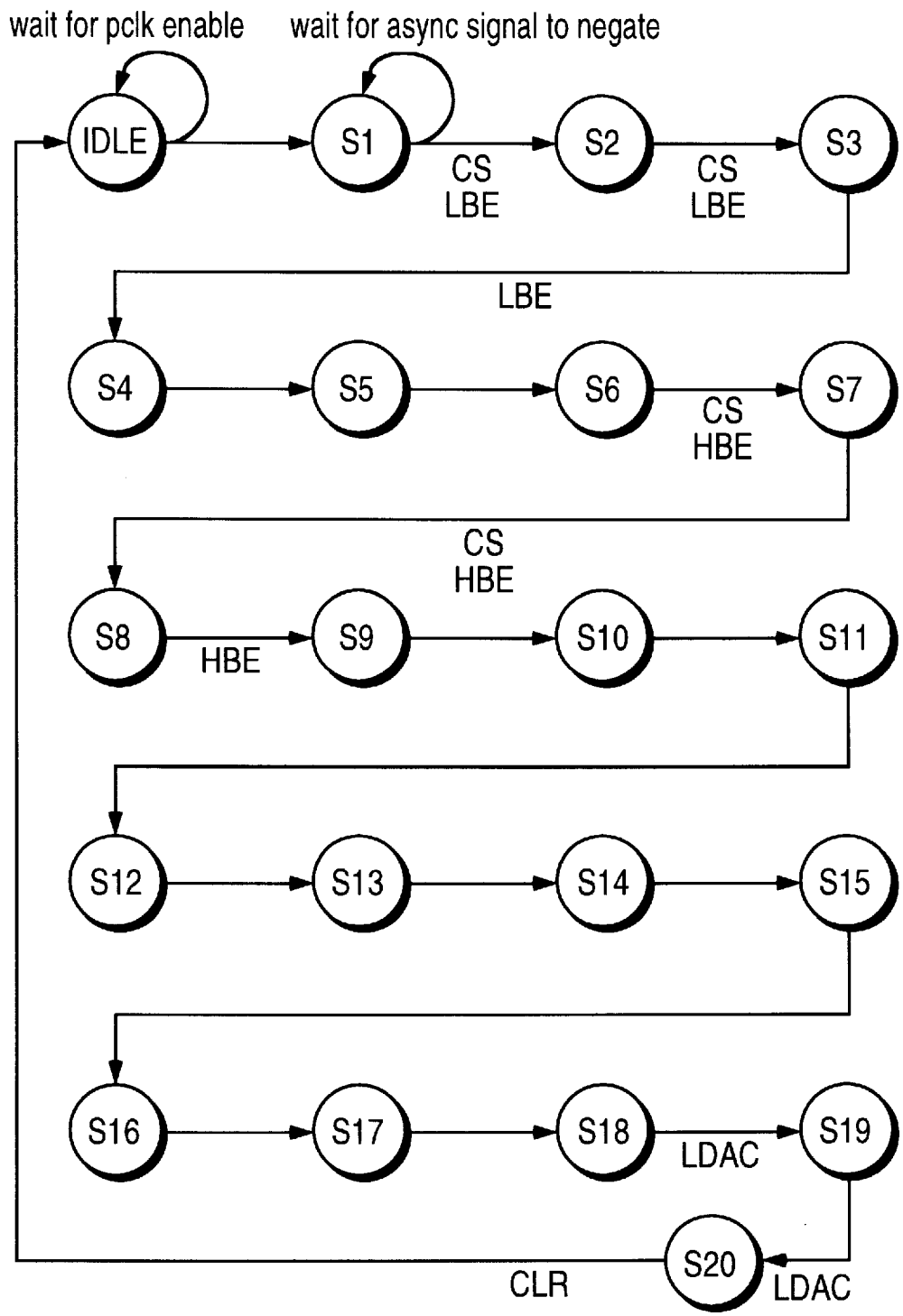
FIG. 4 illustrates the state transitions in the example embodiment of the asynchronous sequential circuit.

FIG. 4 illustrates the logic states and state transitions programmed into the programmable logic device 30 in the example embodiment. The programmable logic device 30 provides a set of functional states S1–S19 in addition to an idle state SO and a terminating state S20. The arrows shown indicate synchronous state transitions and output changes associated with synchronous state transitions. The synchronous state transitions shown provide synchronous changes of the asynchronous outputs 22 and avoids the output timing hazards that occur in some prior asynchronous sequential circuits.

For example, the synchronous state transition from S1 to S2 includes a synchronous low to high level logic transition of the CS and LBE signals which correspond to synchronous high to low transitions of the CS* and LBE* signals. The synchronous or registered changes in the CS* and LBE* signals assures that no hazards propagate.

In an alternative to the example embodiment, the programmable logic device 30 is replaced with flip-flops or latches and a read-only memory (ROM) that is programmed with next state values to provide the functional states S1–S19, the idle state SO, and the terminating state S20 and the state transitions shown above in response to PCLK and DAC—WR*.

The source code for the programmable logic device 30 in the example implementation is set forth below. This source code provides input for automated design apparatus that programs the programmable logic device 30.

```
/* Target Device Type: PALC22vl0-10ns */
/* INPUTS */
PIN 1 = pclk;  /* System clock
PIN 2 = !dacwr
PIN 3 = enable  /* Pclk enable;~disable;Q, NAND
latched         /*!DAC_WR */
/* OUTPUTS */
PIN 23 =    !CLR;    /* for latch reset */
PIN 22 =    !CS;     /* DAC chip select */
PIN 21 =    !LBE;    /* DAC low byte enable */
PIN 20 =    !HBE;    /* DAC high byte enable */
PIN 19 =    LDAC;    /* DAC load */
PIN 18 =    Q4;
PIN 17 =    Q3;
PIN 16 =    Q2;
PIN 15 =    Q1;
PIN 14 =    Q0;
/* Define state bits (state assignment) */
$define S0    'b'00000
$define S1    'b'00001
$define S2    'b'00010
$define S3    'b'00011
$define S4    'b'00100
$define S5    'b'00101
$define S6    'b'00110
$define S7    'b'00111
$define S8    'b'01000
$define S9    'b'01001
$define S10   'b'01010
$define S11   'b'01011
$define S12   'b'01100
$define S13   'b'01101
$define S14   'b'01110
$define S15   'b'01111
```

-continued

```
$define S16   'b'10000
$define S17   'b'10001
$define S18   'b'10010
$define S19   'b'10011
$define S20   'b'10100
$define S21   'b'10101
$define S22   'b'10110
$define S23   'b'10111
$define S24   'b'11000
$define S25   'b'11001
$define S26   'b'11010
$define S27   'b'11011
$define S28   'b'11100
$define S29   'b'11101
$define S30   'b'11110
$define S31   'b'11111
/* Define the state bits as a field for the
sequential
/* circuit */
FIELD sequential circuit = [Q4, Q3, Q2, Q1, Q0];
/* EQUATIONS */
/* Define synchronous SETS and asynchronous RESETS */
Q4.sp =       'b'0;
Q3.sp =       'b'0;
Q2.sp =       'b'0;
Q1.sp =       'b'0;
Q0.sp =       'b'0;
/* CLR.sp =   'b'0; */
CS.sp =       'b'0;
HBE.sp =      'b'0;
LBE.sp =      'b'0;
LDAC.sp =     'b'0;
Q4.ar =       'b'0;
Q3.ar =       'b'0;
Q2.ar =       'b'0;
Q1.ar =       'b'0;
Q0.ar =       'b'0,
/* CLR.ar =   'b'0; */
CS.ar =       'b'0;
HBE.ar =      'b'0;
LBE.ar =      'b'0;
LDAC.ar =     'b'0;
/* Define output enables. */
Q4.oe =       'b'1;
Q3.oe =       'b'1;
Q2.oe =       'b'1;
Q1.oe =       'b'1;
Q0.oe =       'b'1;
/* CLR.oe =   'b'1; */
CS.oe =       'b'1;
HBE.oe =      'b'1;
LBE.oe =      'b'1;
LDAC.oe =     'b'1;
/* Sequential circuit Definition */
SEQUENCE sequential circuit {
    PRESENT S0
        IF enable NEXT S1;   /* only continue if
pclk is running */
        IF !enable NEXT S0;
    PRESENT S1
        IF !dacwr NEXT S2;
        IF dacwr NEXT S1;    /* wait for end of
write to be sure data is latched */
    PRESENT S2
        NEXT S3 OUT CS OUT LBE;
    PRESENT S3
        NEXT S4 OUT CS OUT LBE;
    PRESENT S4
        NEXT S5 OUT LBE;
    PRESENT S5
        NEXT S6;
    PRESENT S6
        NEXT S7 OUT CS OUT HBE;
    PRESENT S7
        NEXT S8 OUT CS OUT HBE;
    PRESENT S8
        NEXT S9 OUT HBE;
    PRESENT S9
        NEXT S10;
    PRESENT S10
```

-continued

```
            NEXT S11;
    PRESENT S11
            NEXT S12;
    PRESENT S12
            NEXT S13;
    PRESENT S13
            NEXT S14;
    PRESENT S14
            NEXT S15;
    PRESENT S15
            NEXT S16;
    PRESENT S16
            NEXT S17;
    PRESENT S17
            NEXT S18;
    PRESENT S18
            NEXT S19 OUT LDAC;
    PRESENT S19
            NEXT S20 OUT LDAC;
    PRESENT S20
            NEXT S0 OUT CLR;   /* see below ... */
            NEXT S0;
}
MIN sequential circuit=4;
/* case wherein the async input is faster than the
sequential circuit (negating clr at startup) */
CLR = sequential circuit:S20 & !pclk & enable;
```

Figure 5:
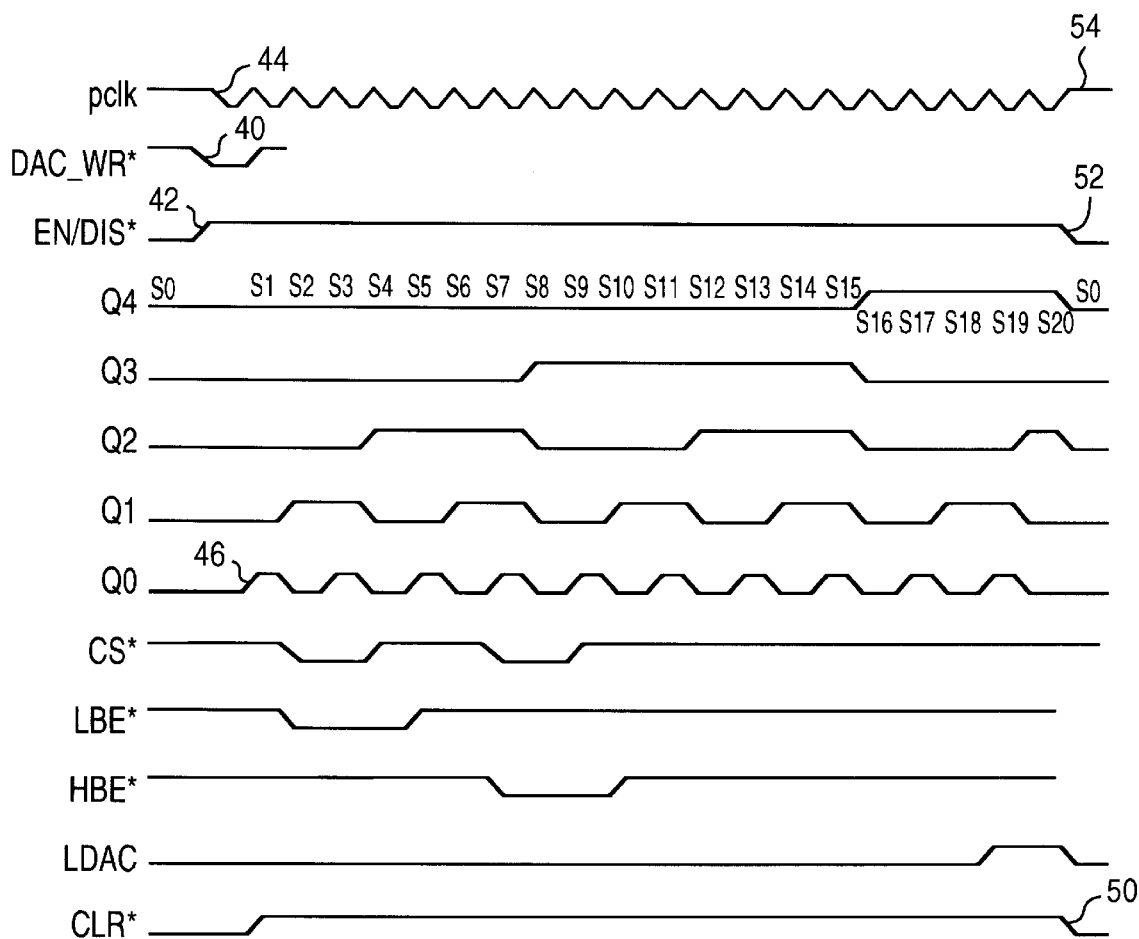
FIG. 5 is a timing diagram for relevant signals in the example embodiment.

FIG. 5 is a timing diagram that shows relevant signals in the example implementation. The synchronous clock PCLK is shown along with the asynchronous write strobe DAC—WR*, the oscillator enable signal EN/DIS*, the state bits Q0–Q4, the control signals CS*, LBE*, HBE*, and LDAC, and the latch clear signal CLR*.

At time 40, a high to low transition of the DAC—WR* signal occurs and causes a low to high transition of the EN/DIS* signal at time 42. The low to high transition of the EN/DIS* signal enables the oscillator 16 and the synchronous clock PLCK starts up at time 44. The time delay between times 40 and 42 corresponds to the propagation delay between inputs and outputs of the NAND gates 34 and 36.

Between times 44 and 50, the programmable logic device 30 transitions from idle state S0 through the functional states S1–S19 and to the terminating state S20. At time 50 in the terminating state, the programmable logic device 30 asserts the CLR* signal with a high to low transition. The asserted CLR* signal resets the latch 14 and causes a high to low transition of the EN/DIS* signal at time 52. The low level of the EN/DIS* signal after time 52 stops the oscillator clock PCLK at time 54 and the programmable logic device 30 is maintained in the idle state S0 until a subsequent DAC—WR* transition causes a restart of the synchronous clock PCLK.

The present design method may be employed to implement a range of frequencies for the synchronous clock PCLK by choosing an appropriate delay for the delay line 32. An lower bound on this delay is the propagation delay of a single NAND gate for the particular process technology used to manufacture the circuit 10. A upper practical bound on this delay may be realized by using a digital divider circuit that divides down the frequency of the synchronous clock PCLK.

Figure 6:
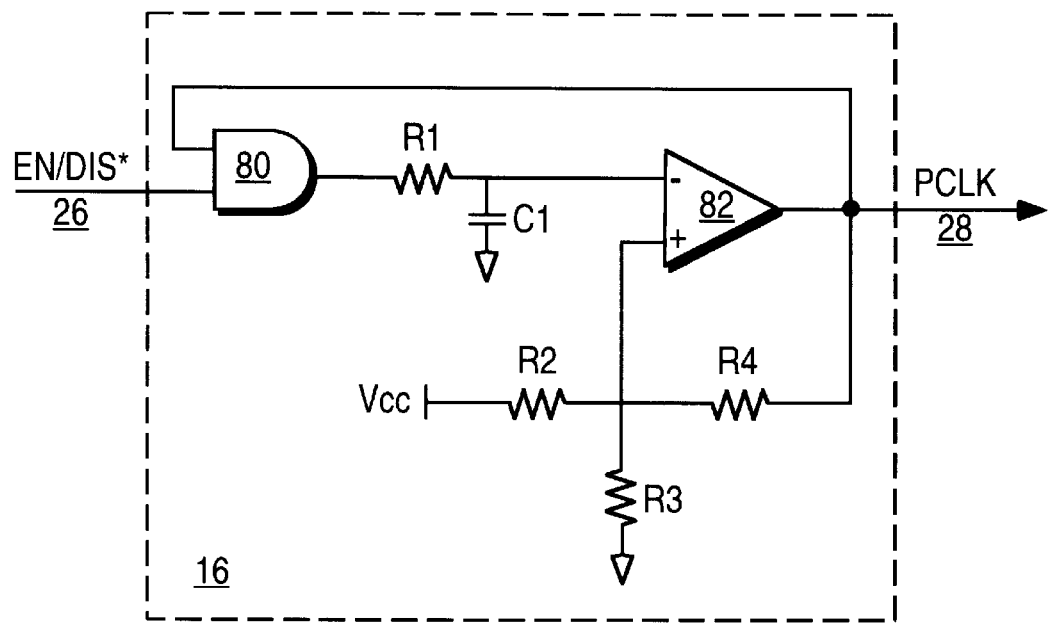
FIG. 6 illustrates an alternative implementation of the gated oscillator which includes an integrator coupled to a comparator.

FIG. 6 illustrates the gated oscillator 16 in another embodiment which includes an integrator comprising a resistor R1 and capacitor C1 coupled to a comparator 82 and a resistor R4. The output of the comparator 82 provides PCLK and is combined with the EN/DIS* signal 26 by an AND gate 80 which enables and disables oscillation. A voltage divider circuit including a pair of resistors R2 and R3 establish a threshold for the comparator 82. Resistor R4 provides positive feedback for hysteresis. In other embodiments, the comparator 82 may be replaced with a schmitt trigger inverter.

Figure 7:
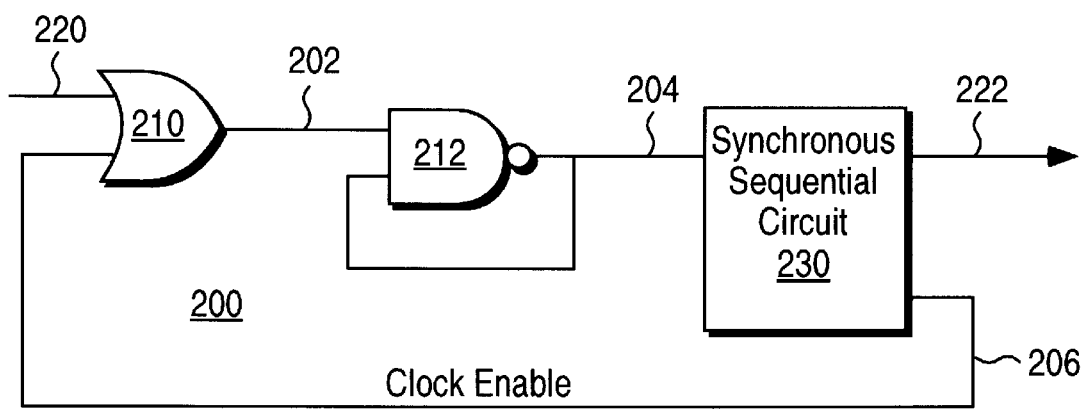
FIG. 7 illustrates another asynchronous sequential circuit designed according to the present design method.

FIG. 7 illustrates another asynchronous sequential circuit 200 designed according to the design method set forth above. The asynchronous sequential circuit 200 generates a set of asynchronous outputs 222 in response to an asynchronous input 220. The asynchronous sequential circuit 200 includes a synchronous sequential circuit 230 which is designed to perform the desired function in accordance with step 100. The synchronous sequential circuit 230 includes a terminating state that occurs immediately before the idle state in accordance with step 110. The synchronous sequential circuit 230 is driven by a synchronous clock 204.

The asynchronous input 220 provides an input to an OR logic gate 210. The output of the OR logic gate 210 provides an oscillator enable signal 202 to a NAND logic gate 212 configured with feedback to provide an oscillator function for generating the synchronous clock 204. The synchronous sequential circuit 230 generates a clock enable signal 206 for enabling and disabling the synchronous clock 204 in accordance with step 130.

The asynchronous input 220 in this embodiment is a pulse signal having a duration which is longer than the period of the synchronous clock 204 plus the propagation delay from an input of the OR logic gate 210 to an output of the sequential circuit 230. A pulse of the asynchronous input 220 starts the synchronous clock 204 which starts the synchronous sequential circuit 230. In response to the synchronous clock 204, the synchronous sequential circuit 230 leaves the idle state and asserts the clock enable signal 106 to keep the synchronous clock 204 enabled after the pulse of the asynchronous input 220 negatessynce clock enable signal 206 is a synchronous output of the synchronous sequential circuit 230. The clock enables signal 206 is negated when the synchronous sequential circuit 230 transitions from the terminating state back to an idle state which stops the synchronous clock 204.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method for implementing an asynchronous sequential circuit, comprising the steps of:

providing a synchronous sequential circuit to perform a desired function of the asynchronous sequential circuit wherein the synchronous sequential circuit runs in response to a synchronous clock;

defining a terminating state of the synchronous sequential circuit for stopping the synchronous sequential circuit by stopping the synchronous clock after completion of the desired function wherein the terminating state occurs before a transition to an idle state of the synchronous sequential circuit;

providing a circuit for generating the synchronous clock such that the synchronous clock is started by an asynchronous input for the asynchronous sequential circuit and is stopped by the terminating state of the synchronous sequential circuit.

2. The method of claim 1, wherein the step of providing a synchronous sequential circuit comprises the step of providing a set of combinatorial logic for performing the desired function and providing a circuit to remember past inputs.

3. The method of claim 2, wherein the step of providing a set of combinatorial logic for performing the desired function comprises the step of providing a set of combinatorial logic for generating a next state based on a present state.

4. The method of claim 3, wherein the step of providing a set of combinatorial logic for performing the desired function comprises the step of providing a set of combinatorial logic for generating the next state based on the present state and an input state.

5. The method of claim 1, wherein the step of defining a terminating state comprises the step of specifying a signal for stopping the synchronous clock such that the signal is asserted in the terminating state.

6. The method of claim 1, wherein the step of providing a circuit for generating the synchronous clock includes the step of providing a circuit for latching the asynchronous input.

7. The method of claim 6, wherein the step of providing a circuit for latching comprises the step of providing a set/reset latch that is set by the asynchronous input and that is reset by the terminating state.

8. The method of claim 1, wherein the step of defining a terminating state comprises the step of choosing an unused member of a set of stored information in the synchronous sequential circuit as the terminating state.

9. An asynchronous sequential circuit, comprising:

synchronous sequential circuit for performing a desired function by transitioning among a series of states to an idle state in response to a synchronous clock, the synchronous sequential circuit having a terminating state between the series of states and the idle state wherein the terminating state is for stopping the synchronous sequential circuit by stopping the synchronous clock;

circuit for generating the synchronous clock such that the synchronous clock is started by an asynchronous input for the asynchronous sequential circuit and is stopped by the terminating state of the synchronous sequential circuit.

10. The asynchronous sequential circuit of claim 9, wherein the synchronous sequential circuit comprises a set of combinatorial logic for performing the desired function and means for remembering past inputs.

11. The asynchronous sequential circuit of claim 10, wherein the means for remembering past inputs comprises a set of latches.

12. The asynchronous sequential circuit of claim 10, wherein the means for remembering past inputs comprises a set of flip-flops.

13. The asynchronous sequential circuit of claim 9, further comprising a circuit for latching the asynchronous input such that a latched asynchronous input starts the synchronous clock signal.

14. The asynchronous sequential circuit of claim 13, wherein the circuit for latching comprises a set/reset latch that is set by the asynchronous input and that is reset by the terminating state.

15. An asynchronous sequential circuit, comprising:

synchronous sequential circuit for performing a desired function by transition among a series of states including a terminating state and then returning to an idle state;

circuit for generating a synchronous clock that drives the synchronous sequential circuit such that the synchronous clock is started by an asynchronous input for the asynchronous sequential circuit and is stopped by the terminating state of the synchronous sequential circuit wherein circuit for generating a synchronous clock comprises a feedback circuit that includes a logical NAND gate.

16. The asynchronous sequential circuit of claim 15, wherein the feedback circuit comprises an integrator circuit and a comparator circuit.

17. The asynchronous sequential circuit of claim 15, wherein the feedback circuit comprises an integrator circuit and a schmitt trigger logic gate.

18. The asynchronous sequential circuit of claim 15, wherein the feedback circuit comprises a silicon delay line.

19. A method of implementing an asynchronous sequential circuit using a synchronous sequential circuit, comprising the steps of:

defining a desired function for the synchronous sequential circuit that includes a series of states and an idle state;

defining a terminating state for the synchronous sequential circuit, wherein the terminating state is used to stop a synchronous clock signal that drives the synchronous sequential circuit through the series of states to the idle state and occurs during a transition to the idle state;

latching an asynchronous input;

generating the synchronous clock signal to drive the synchronous sequential circuit, wherein the synchronous clock signal is started by the latched asynchronous input and stopped by the terminating state.

20. An asynchronous sequential circuit having an asynchronous input, comprising:

a synchronous sequential circuit that performs a desired function through transition among a series of states and then returning to an idle state, wherein the synchronous sequential circuit includes a terminating state for stopping the synchronous sequential circuit by asserting a clear signal;

a latch coupled to the asynchronous input to latch the asynchronous input;

a clock generator coupled to the latch and to the synchronous sequential circuit to generate a synchronous clock signal to drive the synchronous sequential circuit such that the synchronous clock signal is started by the asynchronous input and stopped by the clear signal.

* * * * *